(12) United States Patent
Sakinada et al.

(10) Patent No.: US 8,093,101 B2
(45) Date of Patent: Jan. 10, 2012

(54) ELECTRONIC DEVICE AND METHOD OF FABRICATING THE SAME

(75) Inventors: Kaoru Sakinada, Yokohama (JP);
Takumi Kooriike, Yokohama (JP);
Shunichi Aikawa, Yokohama (JP);
Osamu Kawachi, Yokohama (JP);
Yasufumi Kaneda, Yokohama (JP)

(73) Assignee: Taiyo Yuden Co., Ltd., Tokyo (JP)

(*) Notice: Subject to any disclaimer, the term of this patent is extended or adjusted under 35 U.S.C. 154(b) by 1457 days.

(21) Appl. No.: 11/598,816

(22) Filed: Nov. 14, 2006

(65) Prior Publication Data

US 2008/0111247 A1 May 15, 2008

(51) Int. Cl.
*H01L 21/00* (2006.01)
(52) U.S. Cl. ........................ 438/108; 438/597
(58) Field of Classification Search .................. 438/597, 438/106, 108
See application file for complete search history.

(56) References Cited

U.S. PATENT DOCUMENTS

| 6,586,280 | B2 * | 7/2003 | Cheah ........................... 438/122 |
| 6,903,441 | B2 * | 6/2005 | Wang et al. .................... 257/620 |
| 2005/0095835 | A1 * | 5/2005 | Humpston et al. ............. 438/613 |
| 2006/0183270 | A1 * | 8/2006 | Humpston ..................... 438/106 |

FOREIGN PATENT DOCUMENTS

| JP | 2001-053577 A | 2/2001 |
| JP | 2001-110946 A | 4/2001 |
| JP | 2004-129193 A | 4/2002 |
| WO | 97/02596 A1 | 1/1997 |

* cited by examiner

*Primary Examiner* — Jarrett Stark
*Assistant Examiner* — John M Parker
(74) *Attorney, Agent, or Firm* — Chen Yoshimura LLP

(57) ABSTRACT

There is provided a method of fabricating an electronic device including flip-chip mounting a device chip on a substrate, and supplying solder between adjacent device chips by supplying the solder on the device chips and applying heat and pressure on the solder, and a contact angle of the device chip and the solder is greater than 90° with the solder melted.

12 Claims, 14 Drawing Sheets

θ <90°

θ >90°

APPLY PRESSURE

ELECTRONIC DEVICE AND METHOD OF FABRICATING THE SAME

BACKGROUND OF THE INVENTION

1. Field of the Invention

This invention generally relates to electronic devices and methods of fabricating the same, and more particularly, to an electronic device in which device chips are flip-chip mounted and a method of fabricating the same.

2. Description of the Related Art

Wire bonding methods have conventionally been employed for electrically and mechanically coupling chips and a package in electronic devices. In the wire bonding methods, adhesives have been used for mechanically coupling the device chips and the packages, and metal wires have been used for electrical coupling. However, as the devices have been reduced in size and cost, the flip-chip bonding technique with the use of bumps is mainly employed for coupling the chips and the package in these years.

Japanese Patent Application Publication No. 2001-53577 (hereinafter, referred to as Document 1) and Japanese Patent Application Publication No. 2001-110946 (hereinafter, referred to as Document 2) disclose the configurations of the electronic devices fabricated by use of the flip-chip bonding technique described below. Firstly, bumps are formed on the surface of the device chip by use of the metal wires, in advance. The chip with the bumps thereon is mounted on the wiring pattern formed on the surface of a ceramic package substrate by means of a flip-chip bonder. By this, the bumps and the wiring pattern are bonded together. This bonding couples the device chip and the package substrate electrically and mechanically. Then, the electronic device is completed by sealing with a metal lid.

International Publication No. WO 97/02596 (hereinafter, referred to as Document 3) discloses the following technique. The device chip and the package substrate are electrically and mechanically coupled by use of the bumps in a similar manner to Document 1 and Document 2. Subsequently, a sealing resin is provided to cover the device chip, so the device chip is sealed and the outer shape thereof is formed. In this manner, the electronic device is completed.

Japanese Patent Application Publication No. 2004-129193 (hereinafter, referred to as Document 4) discloses the following technique. The device chip and the package substrate are electrically and mechanically bonded by the bumps. At that time, sealing is also performed simultaneously with the sealing solder formed on the surface of the package substrate in advance. Then, the outer shape is formed by use of the sealing resin. In this manner, the electronic device is completed.

The electronic device in which the device chip and the package substrate are bonded as described above may malfunction, if a foreign material comes into contact with the electrode pattern formed on the device chip surface, or if moisture or the like enters from the outside. To prevent the aforementioned malfunction, the cavity hermetic sealing is performed. In particular, since the device chip surface vibrates with elastic waves in a surface acoustic wave filter or the like that utilizes the elastic waves in a surface acoustic wave device or a piezoelectric thin-film resonator, the cavity hermetic sealing is generally employed.

In the techniques described in Document 1 and Document 2, high airtightness and robust outer shape are maintained by using the metal lid and sealing solder. However, side walls have to be formed in the package substrate, making it difficult to reduce the size and cost thereof.

In the technique described in Document 3, the reduction in size and cost is enabled by use of the sealing resin. However, its airtightness is inferior. Also, it is difficult to block off the influence of electric waves from the outside, because the whole device chip is not shielded by metal. This will lead to the degradation in performance as an electronic device for high frequency.

The technique disclosed in Document 4 has a feature of sealing the device by use of the sealing solder and forming the outer shape by use of the sealing resin. This achieves downsizing and high airtightness. However, since the two types of materials and methods are used for sealing and forming the outer shape, it is difficult to reduce the cost. Also, there is a problem in that there are many restrictions on the shape variations, heating period, and the like, because the sealing solder is provided on the package substrate side in advance. If the respective chips are flip mounted on the sheet-shaped multifaceted substrate and the solder sealing is performed simultaneously, the whole sheet has to be heated at 300° C. or more for more than several minutes. It has been found that this heating melted metal layers into the solder, the metal layers being provided in the device chips and the package substrate and being easily blended into solder, thereby degrading the sealing reliability.

SUMMARY OF THE INVENTION

The present invention has been made in view of the above circumstances and has an object of providing an electronic device that has a cavity hermetic sealing structure and that enables the reduction in size and cost and high airtightness, and a method of fabricating the same.

According to one aspect of the present invention, there is provided a method of fabricating an electronic device including: flip-chip mounting a device chip on a substrate; and supplying solder between adjacent device chips by supplying the solder on the device chips and applying heat and pressure on the solder, and a contact angle of the device chip and the solder is greater than 90° with the solder melted. In accordance with this aspect, the device chip is sealed with a sealing portion made of solder bonded together with the substrate, thereby making it possible to provide the electronic device having high airtightness, high electric shielding effectiveness, and robust bonding and outer shape. In addition, the contact angle of the device chip and the solder is greater than 90°, thereby enabling the cavity to be defined between the device chip and the substrate with ease.

According to another aspect of the present invention, there is provided an electronic device including: a device chip that is flip-chip mounted on a substrate via a cavity; and a sealing portion that seals the device chip so that a side portion of the device chip is made of solder, and twice a thickness of the sealing portion at the side portion of the device chip is greater than a gap between the device chip and the substrate. In accordance with this aspect, it is possible to provide the electronic device having high airtightness, high electric shielding effectiveness, and robust bonding and outer shape.

According to yet another aspect of the present invention, there is provided an electronic device including: a device chip that is flip-chip mounted on a substrate via a cavity; and a sealing portion that seals the device chip so that a side portion of the device chip is made of solder, and a contact angle of the device chip and the solder is greater than 90° with the solder melted. In accordance with this aspect, it is possible to provide the electronic device having high airtightness, high electric shielding effectiveness, and robust bonding and outer shape.

BRIEF DESCRIPTION OF THE DRAWINGS

Exemplary embodiments of the present invention will be described in detail with reference to the following drawings, wherein.

DESCRIPTION OF THE PREFERRED EMBODIMENTS

A description will now be given, with reference to the accompanying drawings, of exemplary embodiments of the present invention.

First Exemplary Embodiment

Figure 1A:
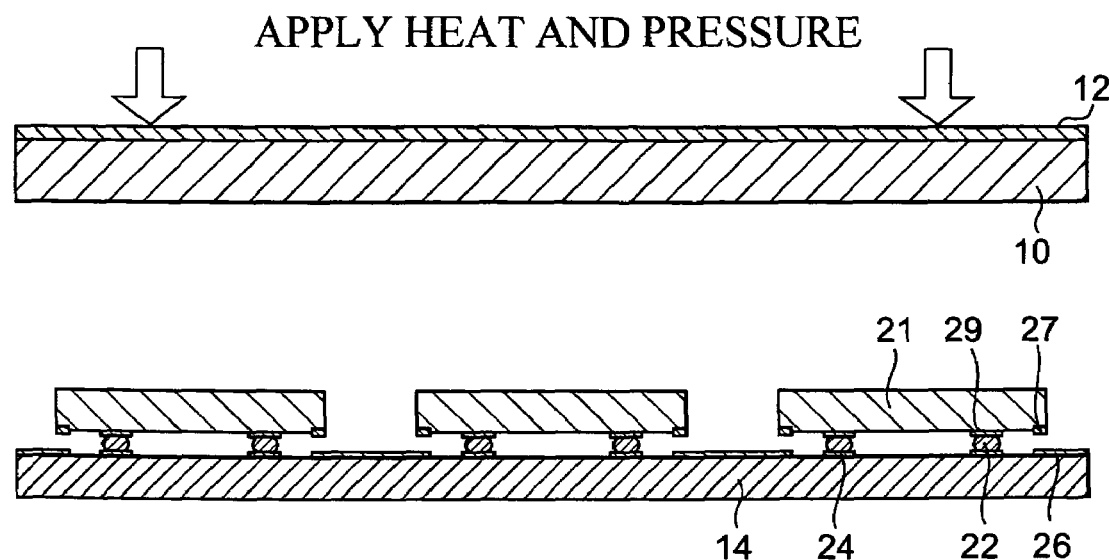
FIG. 1A through FIG. 1C are cross-sectional views showing a fabrication method of an electronic device in accordance with a first exemplary embodiment.
Figure 1B:
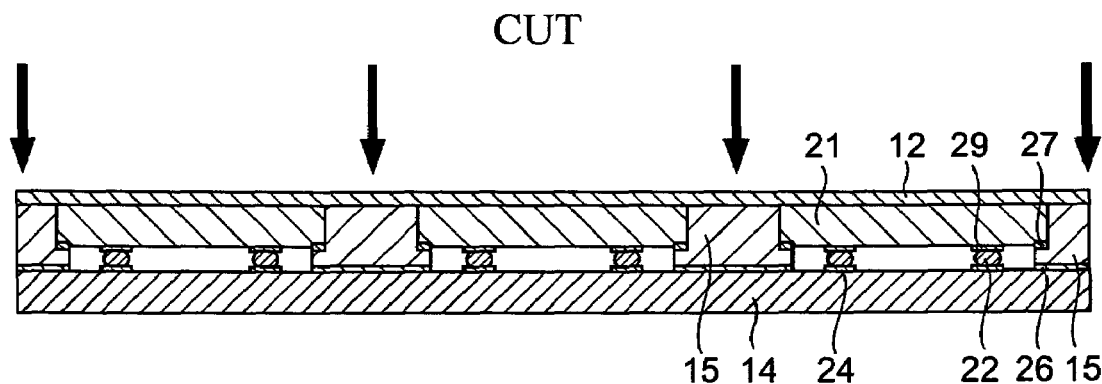
Figure 1C:
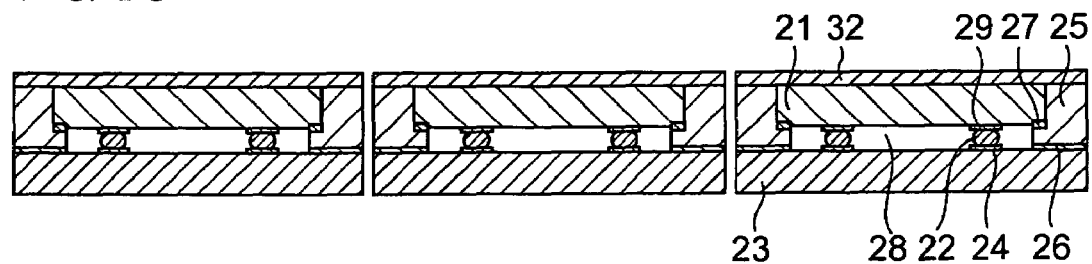

FIG. 1A through FIG. 1C illustrate a fabrication method of an electronic device in accordance with a first exemplary embodiment. Referring to FIG. 1A, there are provided a first metal pattern 26 and a wiring pattern 24, on a package substrate 14 made of an insulating material such as resin, ceramics, or the like. Device chips 21 are flip-chip mounted on the wiring pattern 24 by use of bumps 22. The device chips 21 are arranged above the package substrate 14 in a matrix. The device chips 21 are made of LiTaO$_3$ (lithium tantalate) or LiNbO$_3$ (lithium niobate), and have an electrode pattern (not shown) on the front side thereof (the bottom side in FIG. 1A). The electrode pattern is, for example, an interdigital transducer (IDT) of a surface acoustic wave device. There are provided pads 29 on the surfaces of the device chip 21, and the bumps 22 are formed on the pads 29. Also, there is provided a second metal pattern 27 in the periphery of the surface of the device chip 21. An Sn—Ag (tin-silver) based solder sheet 10 is disposed over the device chip 21, and then a metal layer 12 (solderless sheet) made, for example, of kovar alloy is laminated on the solder sheet 10. A laminated body made up of the solder sheet 10 and the metal layer 12 is heated. In addition, pressure is applied on the solder sheet 10 by use of the metal layer 12. The heating temperature may be set at, for example, 270° C., at which the solder sheet 10 is melted.

Figure 2A:
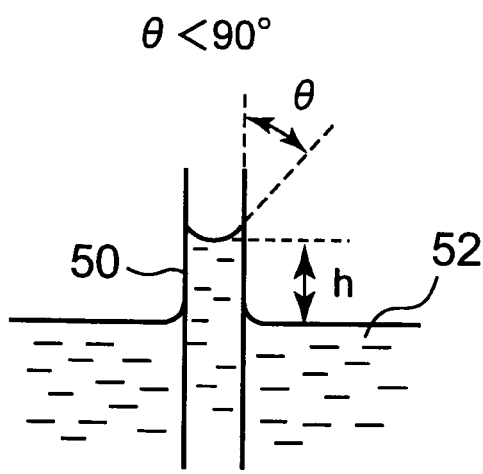
FIG. 2A and FIG. 2B are schematic views illustrating the phenomenon of a capillary tube.
Figure 2B:
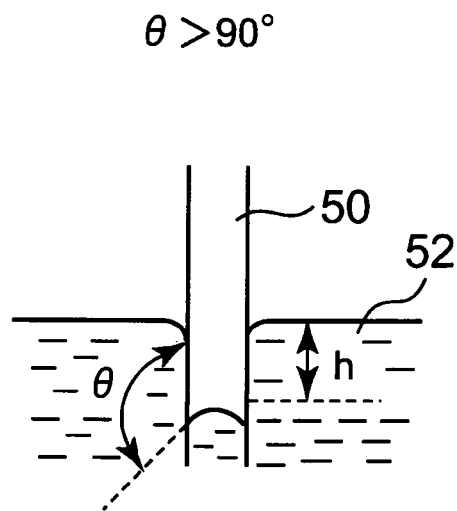

As shown in FIG. 2A and FIG. 2B, when a capillary tube 50 is provided in a liquid 52, a height h of the liquid 52 in the capillary tube 50 is represented by Expression 1.

$$h = 2\gamma \cos \theta / r \rho g \quad \text{(Expression 1)}$$

Here, γ represents surface extension, θ represents contact angle of the liquid 52 with respect to the capillary tube, r represents radius of the capillary tube, ρ represents density of the liquid, and g represents acceleration due to gravity. According to Expression 1, when θ<90°, the height of the liquid 52 in the capillary tube 50 is greater than the liquid level, as shown in FIG. 2A. On the other hand, when θ>90°, the height of the liquid 52 in the capillary tube 50 is smaller than the liquid level, as shown in FIG. 2B.

By transforming Expression 1, Washburn formula of Expression 2 is obtainable.

$$Pr = 2\gamma \cos \theta \quad \text{(Expression 2)}$$

Here, γ represents the surface extension, θ represents the contact angle of the liquid 52 with respect to the capillary tube 50, r represents the radius of the capillary tube 50, and P represents pressure of the liquid 52. According to Expression 2, when θ>90°, the pressure P is necessary for making the liquid 52 enter the capillary tube 50 and the magnitude of P is inversely related to r.

Figure 3:
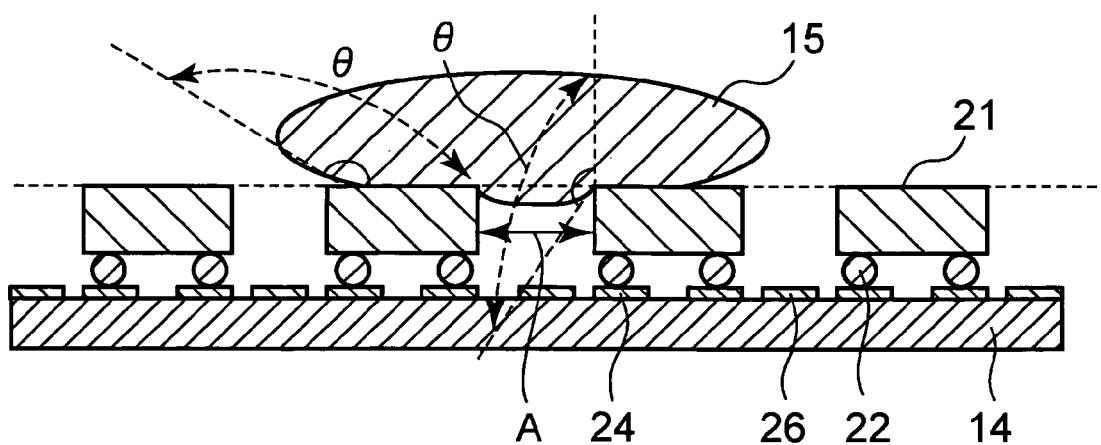
FIG. 3 is a schematic view showing solder at the time of fabricating the electronic device in accordance with a first exemplary embodiment.

FIG. 3 is a schematic view showing a state where a solder 15 is melted on the device chips 21. The contact angle θ of the solder 15 supplied on the device chips 21 is equal to or greater than 90°. In this case, if no pressure is applied on the solder 15, the solder 15 does not enter between the adjacent device chips 21, according to Expression 2. The pressure P necessary for making the solder 15 entering between the adjacent device chips 21 is inversely related to a gap A between the device chips 21.

Figure 4A:
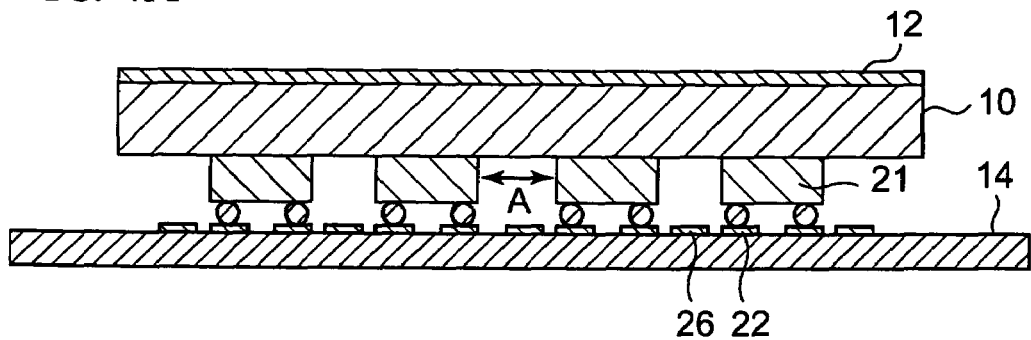
FIG. 4A through FIG. 4D are schematic cross-sectional views showing the fabrication method of an electronic device in accordance with the first exemplary embodiment.
Figure 4B:
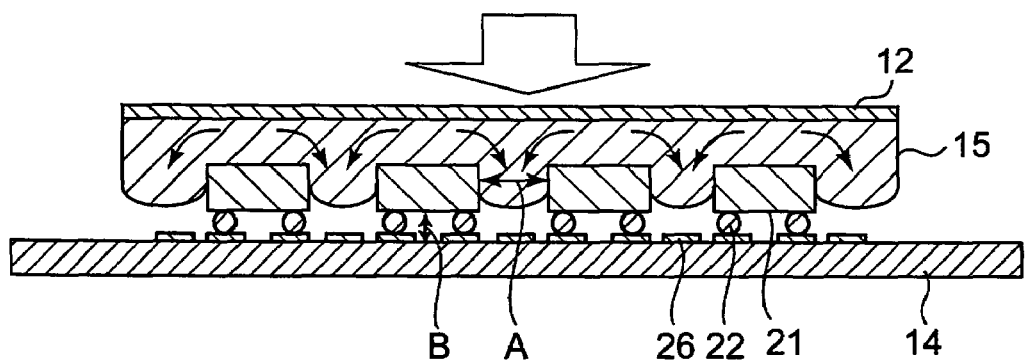

With use of the above-described phenomenon, a description will be given, with reference to schematic views of FIG. 4A through FIG. 4D, of the movement of the solder, when the process from FIG. 1A to FIG. 1B is implemented. Yet, in FIG. 4A through FIG. 4D, the wiring pattern 24, the second metal pattern 27, and the pads 29 are not shown. Referring to FIG. 4A, even when the solder sheet 10 is melted on the device chips 21, the solder 15 is not supplied to the gap A between the device chips 21 adjacently arranged, in a case where the contact angle θ is greater than 90°. As shown in FIG. 4B, the solder 15 is supplied to the gap A between the adjacent device chips 21, by applying to the solder 15, the pressure greater than the pressure P (this pressure is referred to as Pa) obtained by Expression 2.

Figure 4C:
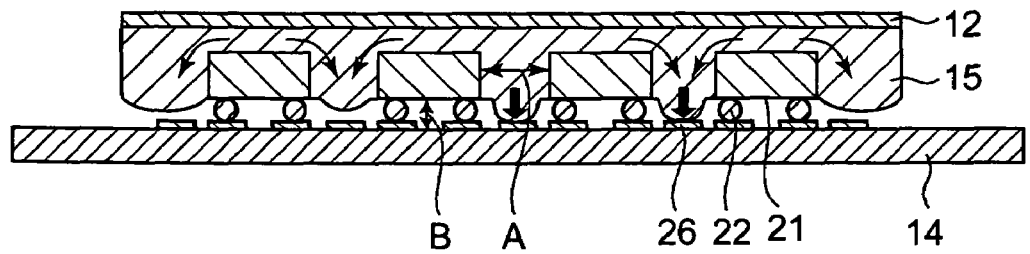

Referring to FIG. 4C, also with respect to a gap B between the device chip 21 and the substrate 14, the solder 15 does not enter the gap B between the device chip 21 and the substrate, unless the pressure is greater than the pressure P (this pressure is referred to as Pb) obtained by Expression 2, in a case where the contact angle θ of the substrate 14 and the solder 15 is greater than 90° and the contact angle θ of the device chip 21 and the solder 15 is greater than 90°. In this manner, it is possible to cause the solder 15 to enter the gap A between the device chips 21 and to prevent the solder 15 from entering the gap B between the device chip 21 and the substrate 14, by making the pressure applied on the solder 15 smaller than Pb and greater than Pa. To achieve this, it is effective that the gap between the device chips 21 should be greater than the gap B between the device chip 21 and the substrate 14, according to Expression 2. Meanwhile, the material of the first metal pattern 26 is selected so that the contact angle θ of the first metal pattern 26 and the solder 15 is smaller then 90°, the first metal pattern 26 being arranged on the surface of the substrate 14, between the adjacent device chips 21. For example, Au is employed. In this manner, the solder 15 is bonded with the first metal pattern 26, as shown in FIG. 4C.

Figure 4D:
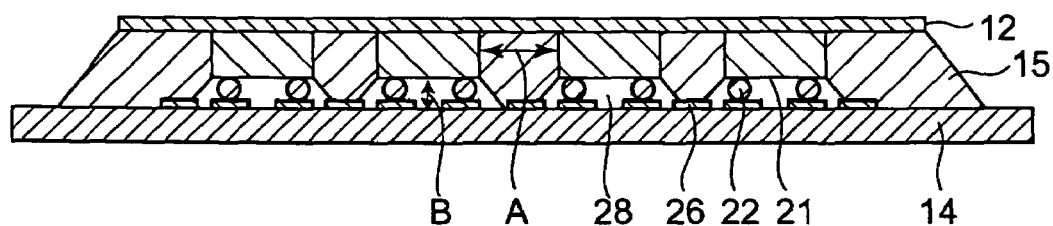

Referring to FIG. 4D, the metal layer 12 comes into contact with the top surfaces (which are the rear surfaces opposite to the front surfaces) of the device chips 21, and the side surfaces of the device chips 21 are covered with the solder 15. Cavities 28 are defined between the device chips 21 and the substrate 14.

Referring to FIG. 1B, the solder 15 is provided to be in contact with the first metal pattern 26 and the second metal pattern 27. Dicing is effected to cut the metal layer 12, the solder 15, and the substrate 14 by means of a dicing saw. By performing this, as shown in FIG. 1C, the top surfaces of the device chips 21 are covered with a solderless layer 32 made of a metal layer, the sides of the device chips 21 are sealed with a sealing portion 25, and the electronic devices in which the cavities 28 are defined between the device chips 21 and the substrate 23 are fabricated.

Figure 5:
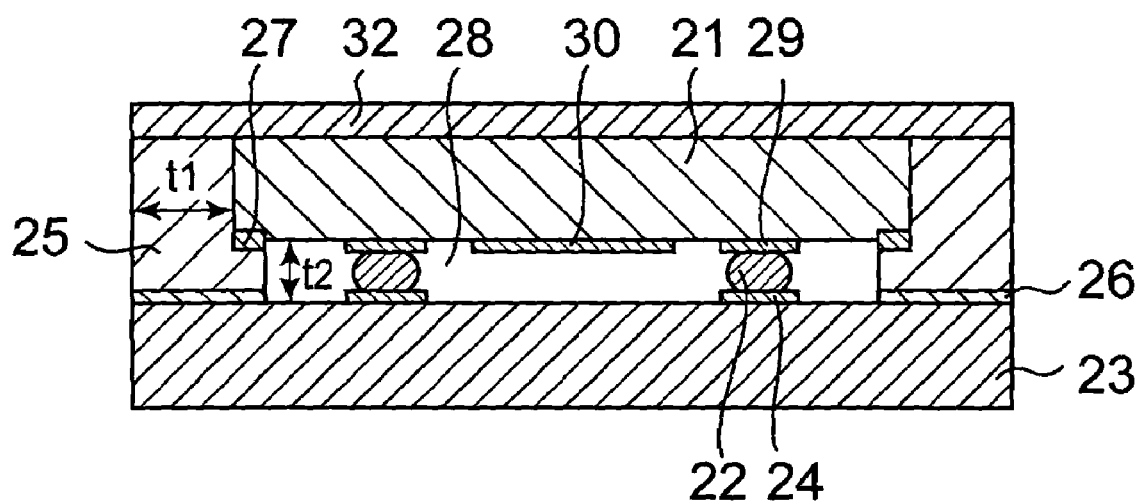
FIG. 5 is a cross-sectional view of the electronic device in accordance with the first exemplary embodiment.

FIG. 5 is a cross-sectional view of an electronic device in accordance with the first exemplary embodiment. The device chip 21 having an electrode pattern 30 such as an IDT or the like is flip-chip mounted on a substrate 23 via a cavity 28. The sealing portion 25 made of solder is provided at the sides of the device chip 21 to seal the device chip 21. The solderless layer 32 made of metal is provided on the sealing portion 25 and on the device chip 21. The cavity 28 is hermitically sealed with the sealing portion 25. In this manner, the electronic device employed in the first exemplary embodiment seals the whole device chip 21 by means of the sealing portion 25 bonded together with the substrate 23, thereby providing the robust bonding and outer shape with high airtightness and high electric shielding effectiveness.

In the fabrication method of the electronic device employed in the first exemplary embodiment, it is possible to make the contact angle of the top surface of the device chip 21 and the solder 15 greater than 90° with the solder 15 melted, as shown in FIG. 3, by employing, for example, LiNbO$_3$ substrate or LiTaO$_3$ substrate for the device chips 21 and employing the Sn—Ag based solder. This makes it possible to define the cavities 28 between the device chips 21 and the substrate 14, when the solder 15 is supplied between the adjacent device chips 21, as shown in FIG. 4A though FIG. 4D. Here, the substrate 14 and the solder 15 may be so selected as to satisfy the above-described circumstances.

In addition, it is possible to make the contact angle of a region in the substrate 14 opposing the device chip 21 and the solder 15 greater than 90° with the solder 15 melted, by employing, for example, aluminum oxide or aluminum nitride for the substrate. This enables the cavity 28 to be defined between the device chip 21 and the substrate 14 with certainty.

As shown in FIG. 4C and FIG. 4D, the solder 15 is brought into contact with the substrate 14 in the gap A between the adjacent device chips 21, and the solder 15 is not allowed to enter the gap B between the device chip 21 and the substrate 14. That is to say, it is preferable that the pressure applied on the solder 15 be so set that the solder 15 enters the gap A between the adjacent device chips 21 and the solder does not enter the gap B between the device chip 21 and the substrate 14. This makes it possible to define the cavities 28 sealed with the sealing portion 25 made of solder, as shown in FIG. 4C.

Preferably, the gap A between the adjacent device chips 21 is wider than the gap B between the device chip 21 and the substrate. This allows the solder 15 to enter the gap A between the device chips 21, and does not allow the solder 15 to enter the gap B between the device chip 21 and the substrate 14, as shown in FIG. 4C.

As shown in FIG. 5, twice a thickness t1 of the sealing portion 25 made of solder at the side of the device chip 21 is made greater than a gap t2 between the device chip 21 and the substrate 23. This enables the gap A between the device chips 21 to be greater than the gap B between the device chip 21 and the substrate 14, in the fabrication of the electronic device employed in the first exemplary embodiment, with reference to FIG. 4A through FIG. 4D.

Preferably, the first metal pattern 26 is provided between the adjacent device chips 21 in the substrate 14. The contact angle θ of the metal such as, for example, Au or the like and the solder is smaller than 90°. Therefore, the solder 15 can be blended into the first metal pattern 26 with ease. This allows the solder 15 to be in contact with the substrate 14 so that the cavities 28 are defined between the device chips 21, as shown in FIG. 1B. The electronic device fabricated in this fabrication method includes the first metal pattern 26 in the periphery of the substrate 23, and the sides thereof made up of solder are in contact with the first metal pattern 26, as shown in FIG. 1C.

Preferably, the second metal pattern 27 is provided in the periphery of the side with which the device chip 21 is flip-chip mounted. As described above, it is possible to cause the solder 15 to be brought into contact with the second metal pattern 27, by using a metal such as Au or the like for the second metal pattern 27. This enables the cavities 28 hermetically sealed with more certainty. The electronic device fabricated in this fabrication method includes the second metal pattern 27 in the periphery of the surface at the substrate 23 side of the device chip 21, and the side portion made of solder is in contact with the second metal pattern 27.

The solder 15 is pressurized by use of the metal layer 12 (solderless sheet) supplied over the device chips 21. This makes it possible to apply pressure on the solder 15 with ease. The electronic device fabricated in this fabrication method includes the solderless layer 32 on the sealing portion 25 made of solder, as shown in FIG. 1C.

As shown in FIG. 1B, Dicing is effected to cut the solder 15 and the substrate 14 at the gap A between the device chips 21 adjacently arranged. This allows the fabrication of the electronic device having the side surfaces of the solder 15.

Second Exemplary Embodiment

Figure 6A:
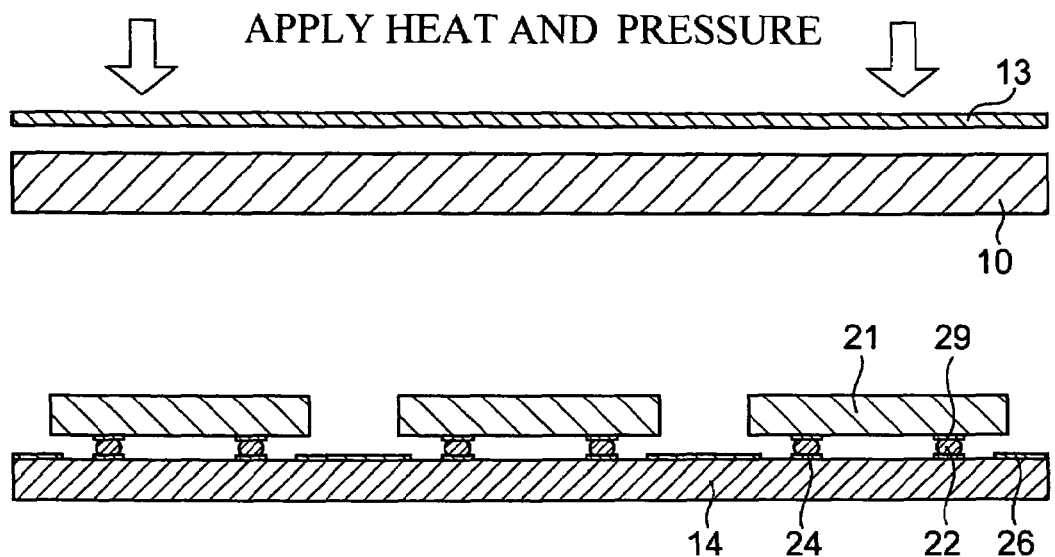
FIG. 6A through FIG. 6C are cross-sectional views showing the fabrication method of the electronic device in accordance with a second exemplary embodiment.
Figure 6B:
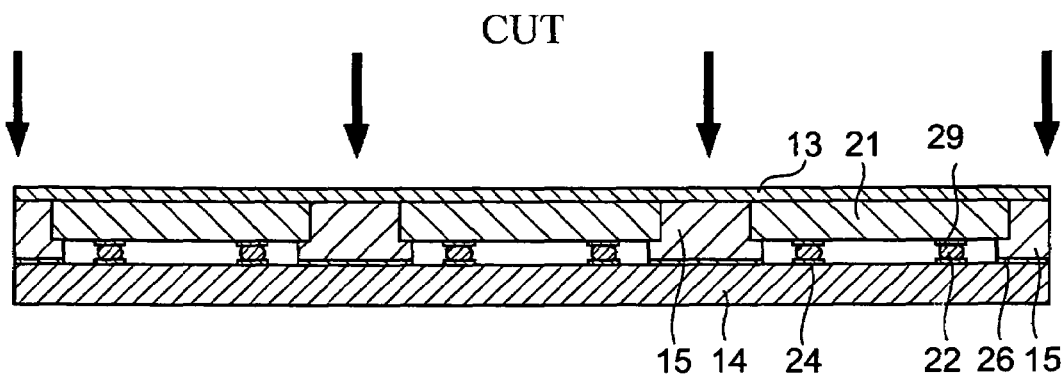
Figure 6C:
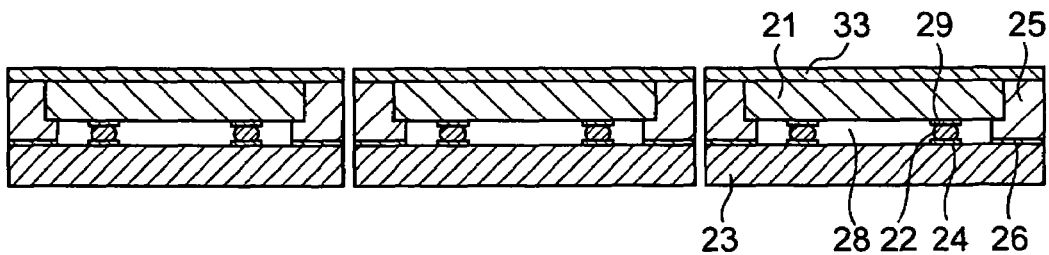

FIG. 6A through FIG. 6C illustrate a fabrication method of an electronic device in accordance with a second exemplary embodiment. Referring to FIG. 6A, the Sn—Ag based solder sheet 10 is deposited over the device chips 21, and a resin layer 13 (solderless sheet) made of polyimide or the like is laminated on the solder sheet 10. The laminated body made up of the solder sheet 10 and the resin layer 13 is heated. Also, pressure is applied on the solder sheet 10 by use of the resin layer 13. Other configurations are same as those of FIG. 1A used in the first exemplary embodiment, and a description will be omitted. In a similar manner to the first exemplary embodiment, referring to FIG. 6B, the resin layer 13 is provided to be in contact with the top surfaces of the device chips 21. Dicing is effected to cut the resin layer 13 and the solder 15. Other configurations are same as those of FIG. 1B used in the first exemplary embodiment, and a description will be omitted. Referring to FIG. 6C, the electronic device employed in the second exemplary embodiment is completed.

The resin layer 13 may be made, for example, of a sheet-shaped polyimide layer (having wiring of Cu on one side thereof) or a glass epoxy based film layer.

Figure 7:
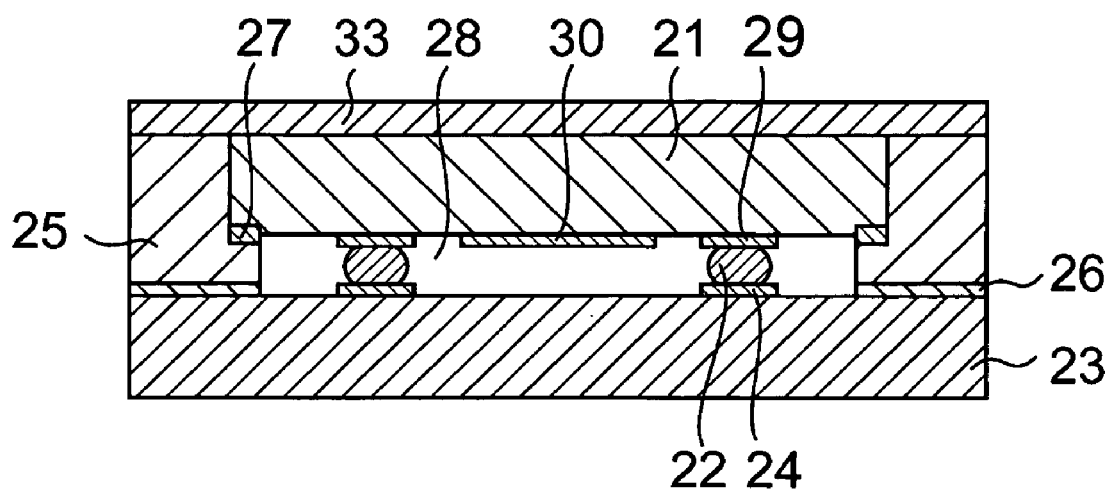
FIG. 7 is a cross-sectional view of the electronic device in accordance with the second exemplary embodiment.

FIG. 7 is a cross-sectional view of the electronic device in accordance with the second exemplary embodiment. There is provided a solderless layer 33 made of resin on the device chip 21 and on the sealing portion 25 made of solder. Other configurations are same as those of FIG. 5 used in the first exemplary embodiment, and a description will be omitted. As stated, in the second exemplary embodiment, solderless sheet and the solderless layer are used for the resin layer 13, instead of the metal layer 12 employed in the first exemplary embodiment. In this manner, the solderless sheet and the solderless layer may employ a metal layer or an insulating layer. The solderless sheet is used for applying pressure on the solder sheet 10, but has a function of protecting the whole electronic device and also serves as an auxiliary structure of the sealing portion 25 made of solder.

If kovar alloy is used as the metal layer 12, the thermal expansion coefficient of the kovar alloy is close to that of ceramic. For this reason, if a ceramics substrate is employed for the substrate 23, it is possible to reduce the distortion resulted from the difference in the thermal expansion coefficient between the device chip 21 and the substrate 23. Therefore, no stress is applied on the device chip 21, enabling the improvement of reliability and electric properties.

Third Exemplary Embodiment

Figure 8A:
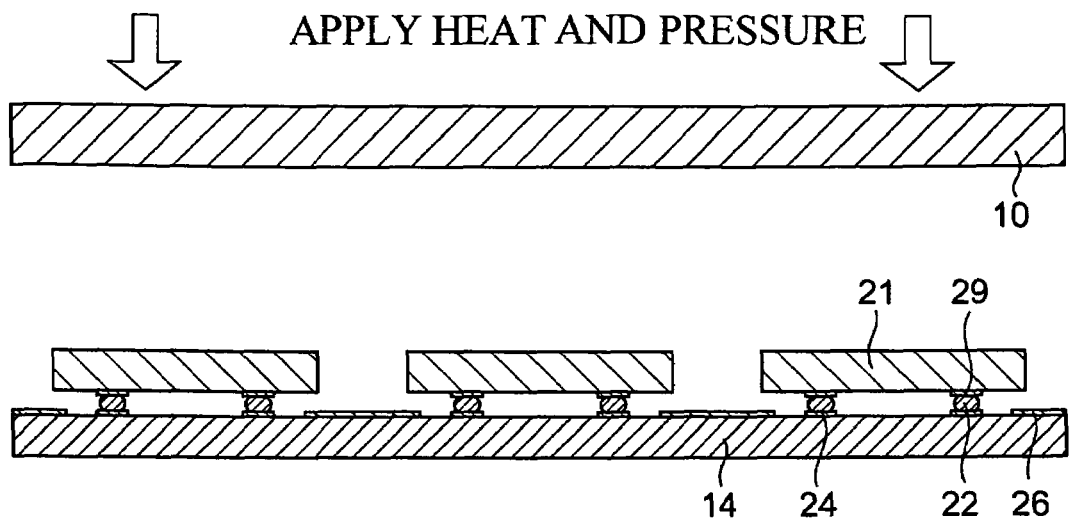
FIG. 8A through FIG. 8C are cross-sectional views showing the fabrication method of the electronic device in accordance with a third exemplary embodiment.
Figure 8B:
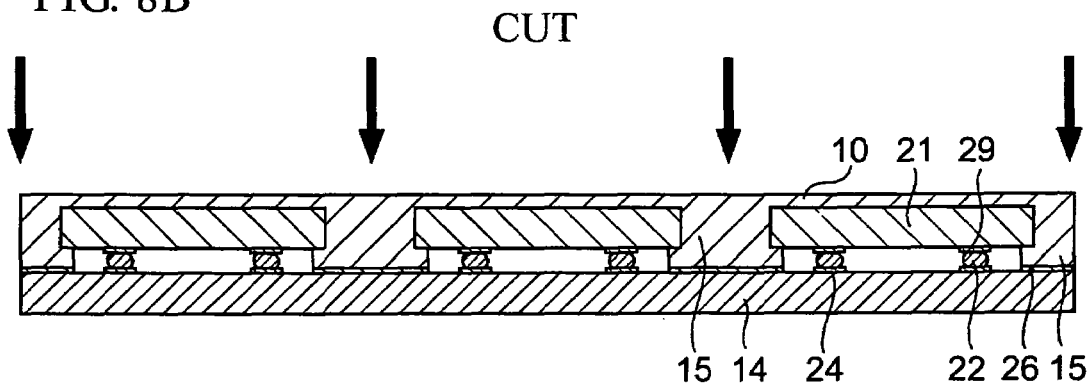
Figure 8C:
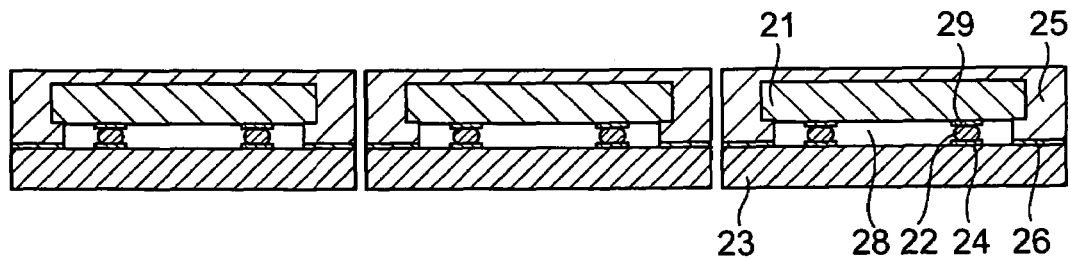

FIG. 8A through FIG. 8C illustrate a fabrication method of an electronic device in accordance with a third exemplary embodiment. Referring to FIG. 8A, the Sn—Ag based solder sheet 10 is deposited over the device chips 21, and the solder sheet 10 is heated and pressurized. Other configurations are same as those of FIG. 1A used in the first exemplary embodiment, and a description will be omitted. Referring to FIG. 8B, the solder 15 is made to remain on the device chips 21. Dicing is effected to cut the solder 15. Other configurations are same as those of FIG. 1B used in the first exemplary embodiment, and a description will be omitted. Referring to FIG. 8C, the electronic device employed in the third exemplary embodiment is completed.

Figure 9:
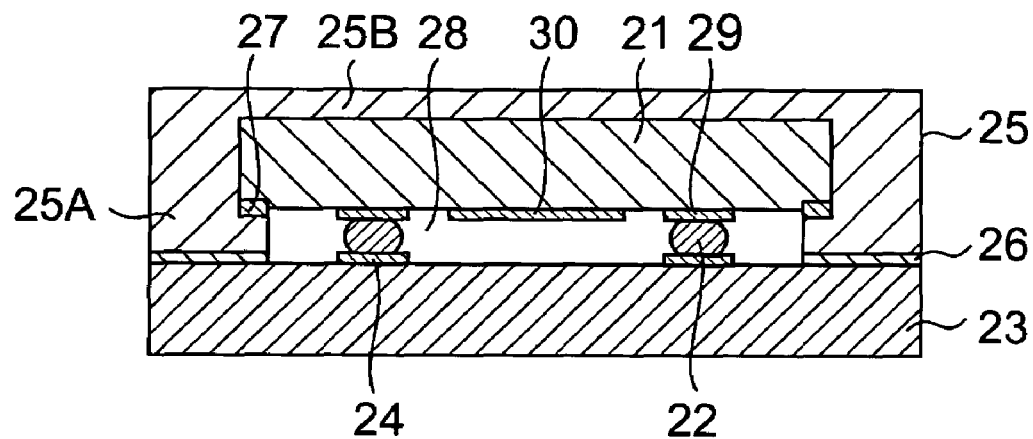
FIG. 9 is a cross-sectional view of the electronic device in accordance with the third exemplary embodiment.

FIG. 9 is a cross-sectional view of the electronic device in accordance with the third exemplary embodiment. The device chip 21 is sealed with a sealing portion 25 fully made of solder. That is, side portions 25A and a top portion 25B of the sealing portion 25 respectively cover the side surfaces and the top surface of the device chip 21. Other configurations are same as those of FIG. 5 used in the first exemplary embodiment, and a description will be omitted. In this manner, in the third exemplary embodiment, the solderless sheet is not used, and the solderless layer is not included. This makes it possible to reduce members included in the electronic device.

Figure 10:
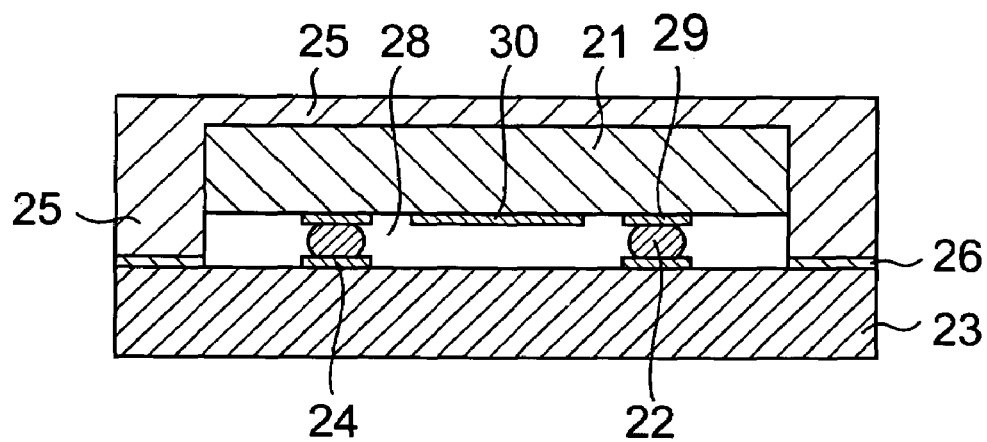
FIG. 10 is a cross-sectional view of the electronic device in accordance with a variation of the third exemplary embodiment.

FIG. 10 is a variation of the third exemplary embodiment. The electronic device employed in the variation of the third exemplary embodiment does not include the second metal pattern 27, as compared to FIG. 9 used in the third exemplary embodiment. Also, the external size of the device chip 21 is almost equal to the internal size of the first metal pattern 26. For this reason, the sealing portion 25 is not allowed to flow under the device chip 21, therefor completing the cavity sealing in the shape of FIG. 10.

Fourth Exemplary Embodiment

Figure 11A:
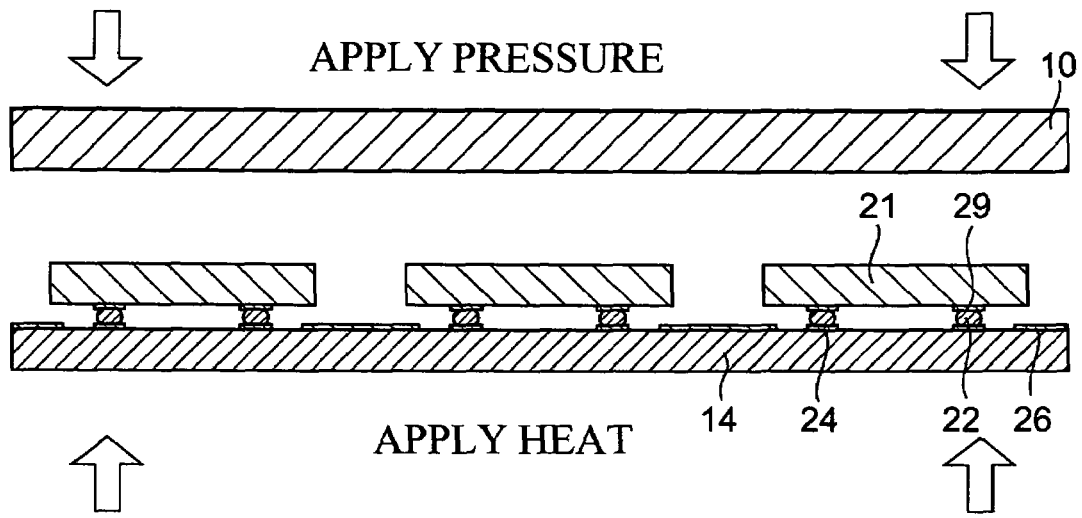
FIG. 11A through FIG. 11C are cross-sectional views showing the fabrication method of the electronic device in accordance with a fourth exemplary embodiment.
Figure 11B:
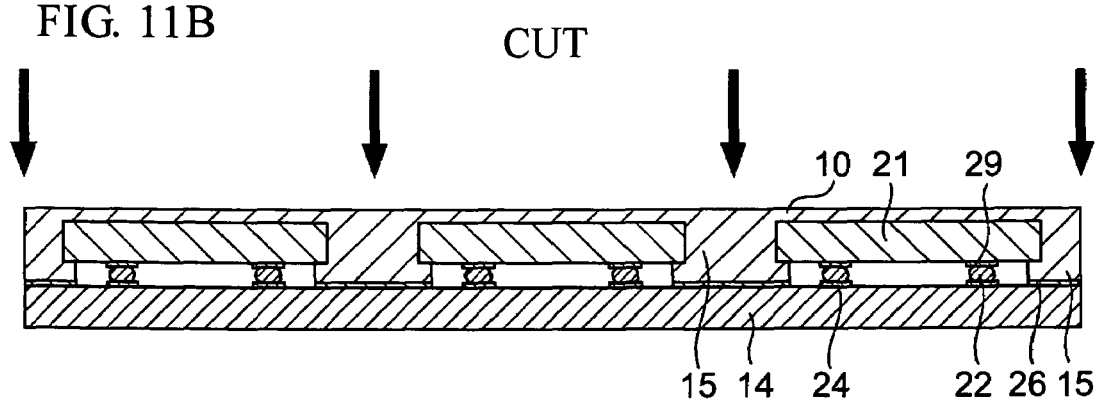
Figure 11C:
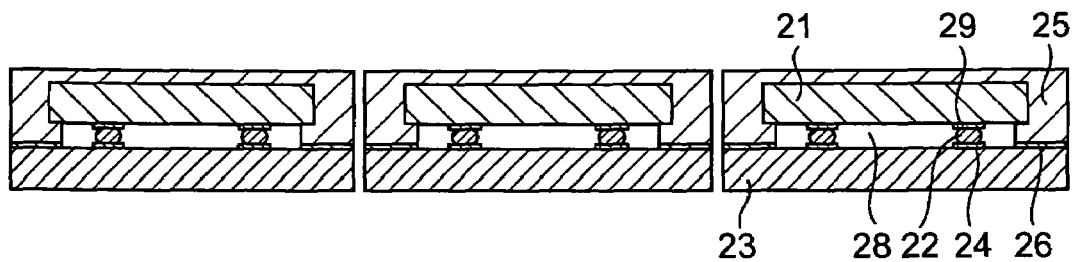

FIG. 11A through FIG. 11C illustrate a fabrication method of an electronic device in accordance with a fourth exemplary embodiment. Referring to FIG. 11A, the substrate 14 is heated in advance. Then, the solder sheet 10 is supplied over the device chips 21. Subsequently, the solder sheet 10 is pressurized. Other configurations are same as those of FIG. 8A used in the third exemplary embodiment, and a description will be omitted. Referring to FIG. 11B and FIG. 11C, dicing is effected to cut the solder 15 and the substrate 14 in a similar manner to FIG. 8B and FIG. 8C used in the third exemplary embodiment. The substrate 14 may be heated in advance, and then the solder sheet 10 may be deposited and pressurized as in the fourth exemplary embodiment. Also in the first through third embodiments, the substrate 14 may be heated in advance, and then, the solder sheet 10 may be deposited and pressurized in a similar manner.

Fifth Exemplary Embodiment

Figure 12A:
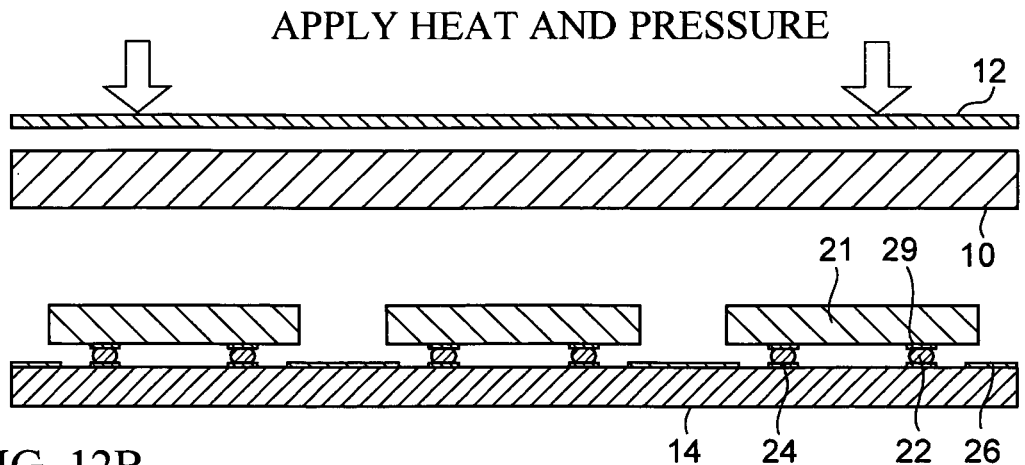
FIG. 12A through FIG. 12D are cross-sectional views showing the fabrication method of the electronic device in accordance with a fifth exemplary embodiment.
Figure 12B:
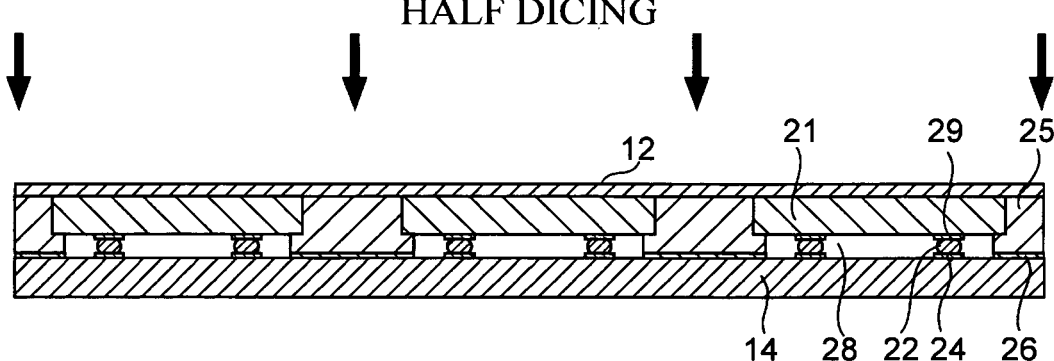

FIG. 12A through FIG. 12D illustrate a fabrication method of an electronic device in accordance with a fifth exemplary embodiment. Referring to FIG. 12A, the solder sheet 10 and the metal layer 12 are deposited over the device chips 21, and the solder sheet 10 is heated and pressurized, in a similar manner to FIG. 1A used in the first exemplary embodiment. Referring to FIG. 12B, half dicing is effected to cut the metal layer 12 and the solder 15 up to the surface of the substrate 14.

Figure 12C:
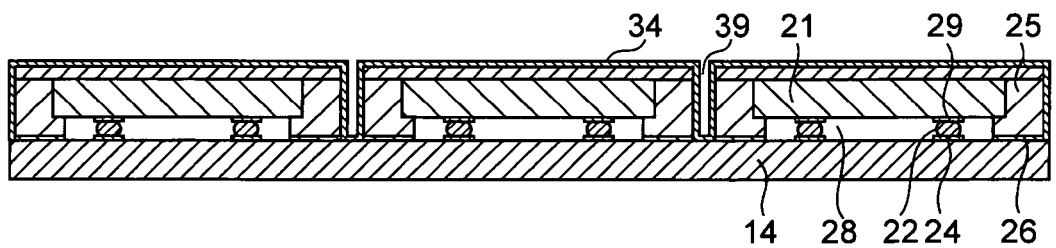

Referring to FIG. 12C, a protection film 34 is formed to cover the metal layer 12, the sealing portion 25 made of solder, and the substrate 14. The protection film 34 may be made of a metal film or a resin film (insulating film). If the protection film 34 is made of a metal film, Ni (nickel) is deposited by 10 to 20 μm by means of electrolytic plating to form the protection film 34. The protection film 34 may be made of a plated film and a deposited film such as Cu or the like, in addition to Ni. If the protection film 34 is made of a resin film, epoxy resin, for example, may be employed. The protection film 34 may be formed by applying the epoxy resin with a spray or the like.

Figure 12D:
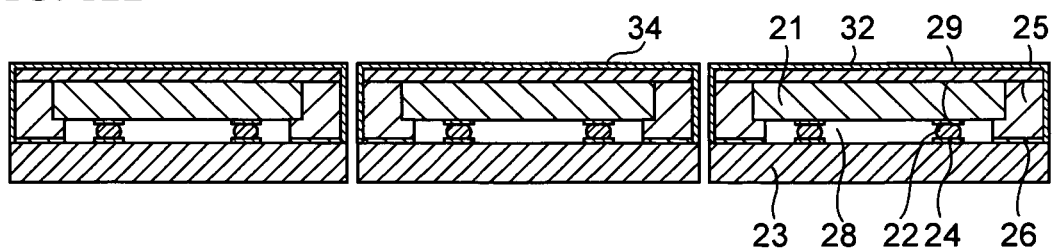

Referring to FIG. 12D, full dicing is effected to cut the regions of the substrate 14 where the half dicing is effected. As stated heretofore, the electronic device employed in the fifth exemplary embodiment is completed.

Figure 13:
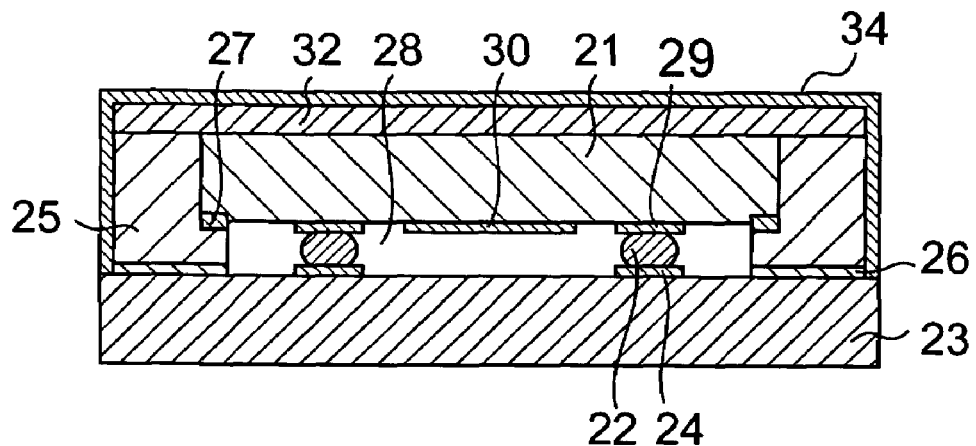
FIG. 13 is a cross-sectional view of the electronic device in accordance with a fifth exemplary embodiment.

FIG. 13 is a cross-sectional view of the electronic device in accordance with the fifth exemplary embodiment. As compared to FIG. 5 used in the first exemplary embodiment, the protection film 34 covers the solderless layer 32, the sealing portion 25 made of solder, the first metal pattern 26, and the substrate 23. Other configurations are same as those of FIG. 5 used in the first exemplary embodiment, and a description will be omitted.

In accordance with the fifth exemplary embodiment, the protection film 34 is so provided as to prevent the distortion of the sealing portion 25 provided inside the protection film 34 due to an external force or heat, thereby improving the allowable temperature limit of the electronic device. For instance, no damage is given to the function and appearance of the electronic device even in the reflow profile at the melting point of the solder or over.

Figure 14:
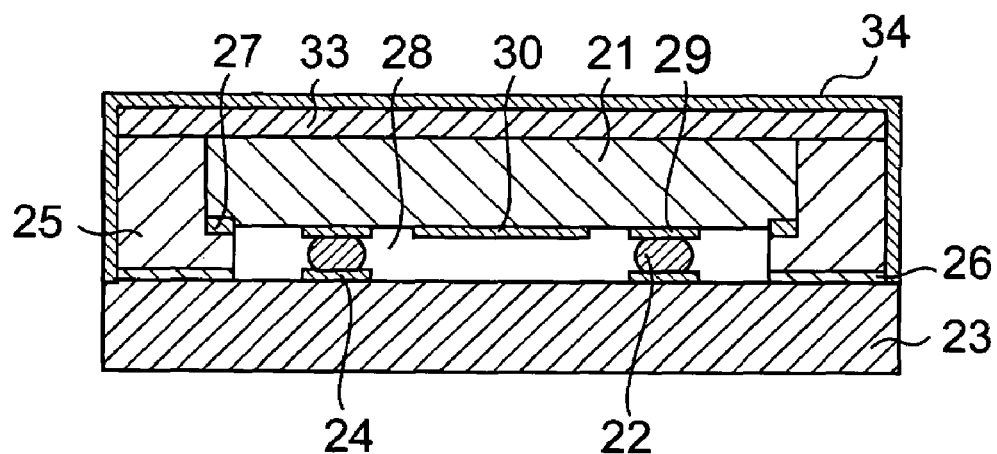
FIG. 14 is another example of the electronic device in accordance with the fifth exemplary embodiment.
Figure 15:
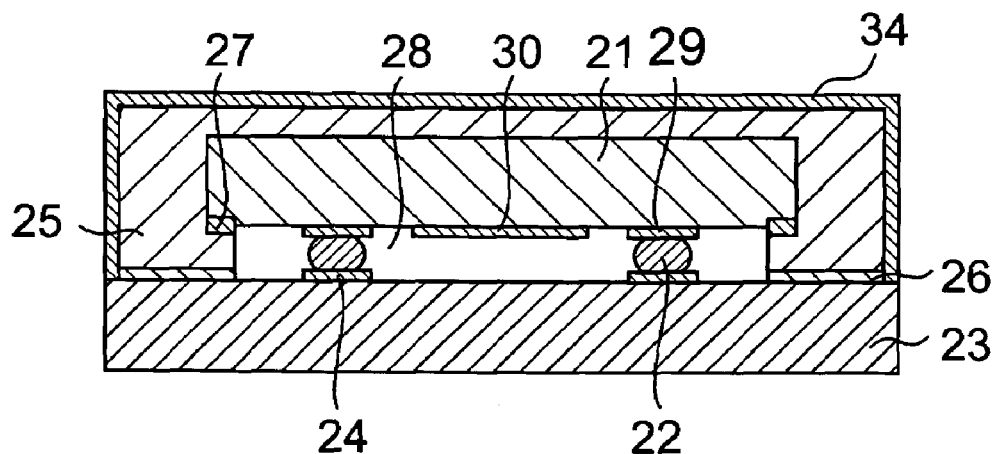
FIG. 15 is yet another example of the electronic device in accordance with the fifth exemplary embodiment.
Figure 16:
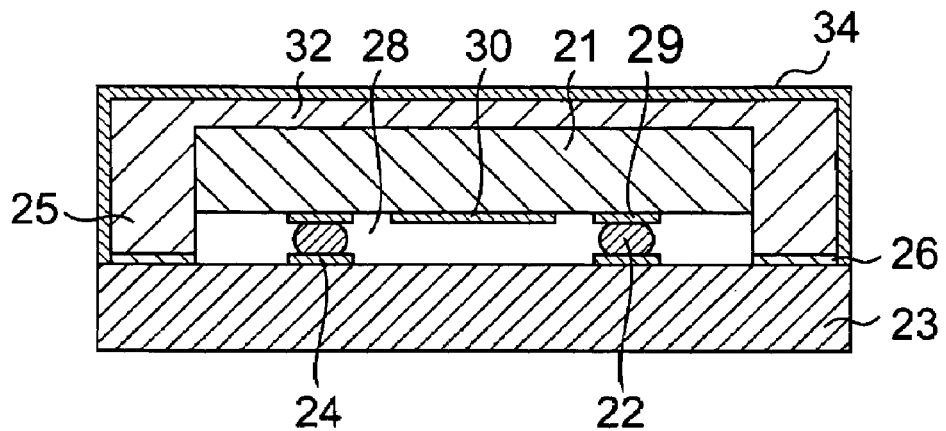
FIG. 16 is further another example of the electronic device in accordance with the fifth exemplary embodiment.

As shown in FIG. 14, the protection film 34 may be added to FIG. 7 used in the second exemplary embodiment. In addition, as shown in FIG. 15, the protection film 34 may be added to FIG. 9 used in the third exemplary embodiment. Furthermore, as shown in FIG. 16, the protection film 34 may be added to the variation of the third exemplary embodiment.

Sixth Exemplary Embodiment

Figure 17:
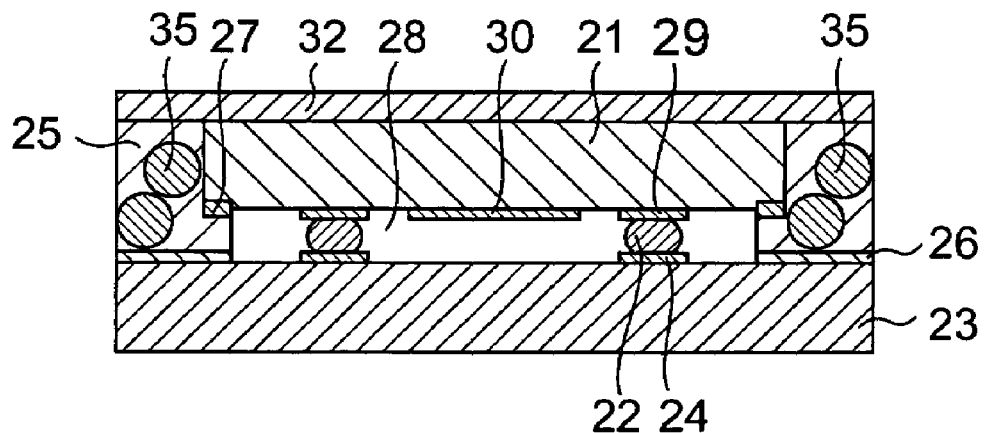
FIG. 17 is a cross-sectional view of the electronic device in accordance with a sixth exemplary embodiment.

FIG. 17 is a cross-sectional view of the electronic device in accordance with a sixth exemplary embodiment. Referring to FIG. 17, the sealing portion 25 includes metal balls 35 (solderless portion), as compared to FIG. 5 used in the first exemplary embodiment. The metal ball 35 is covered with solder, is a ball made of Cu (copper), and has a diameter of 0.15 mm, for example. Sn is plated on the surface of Cu. If Sn—Ag is used for solder, an Sn—Cu based compound is generated to form a layer having a high melting point in the periphery of the metal ball 35. The heat resistance is improved at the sealing portion 25 more than the case where there is provided no metal ball 35. Even when Ni balls are used instead of the Cu balls, it has been found that the same effect was available. The use of the metal balls 35 has an effect of reducing the volume of solder. Therefore, the cost reduction is expected if a costly solder material such as Au—Sn solder or the like is used.

Figure 18:
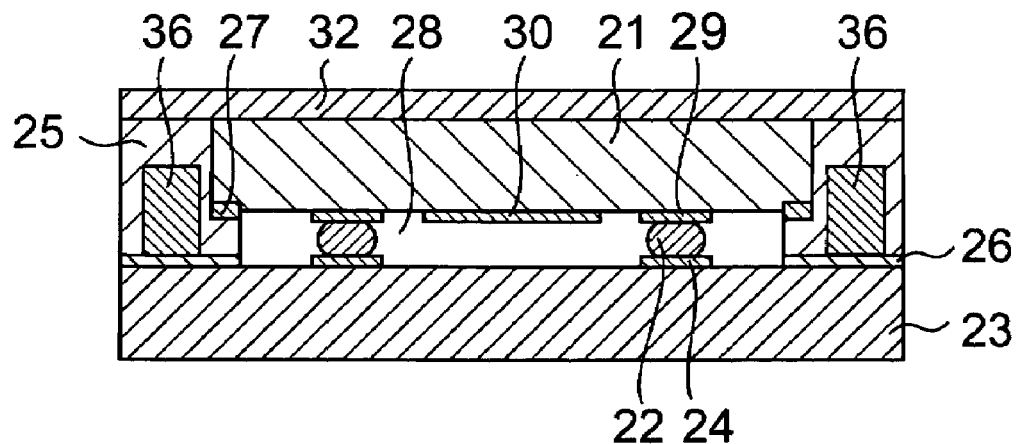
FIG. 18 is a cross-sectional view of the electronic device in accordance with a variation of the sixth exemplary embodiment.

FIG. 18 is a cross-sectional view in accordance with a variation of the sixth exemplary embodiment. Referring to FIG. 18, a metal frame 36 (solderless portion) is employed instead of the metal balls 35. The metal frame 36 is covered with solder. The metal frame 36 is positioned on the first metal pattern 26. The metal frame 36 is so formed as to surround the device chip 21. It is preferable that the material into which the solder is easily blended (for example, kovar alloy) be used for the metal frame 36. The material into which the solder is easily blended may be employed and the surface treatment may be performed. It is possible to improve the heat resistance and achieve the cost reduction. The solderless portion such as the metal balls 35, the metal frame 36, or the like may be used for the sealing portion 25 used in the second through fifth exemplary embodiments.

Seventh Exemplary Embodiment

Figure 19A:
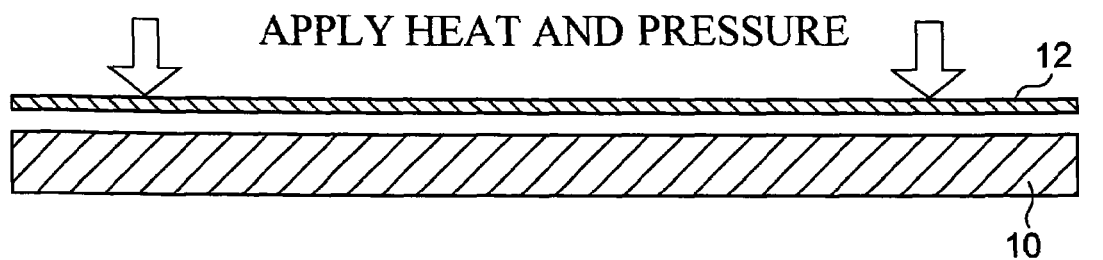
FIG. 19A through FIG. 19C are cross-sectional views showing the fabrication method of the electronic device in accordance with a seventh exemplary embodiment.
Figure 19B:
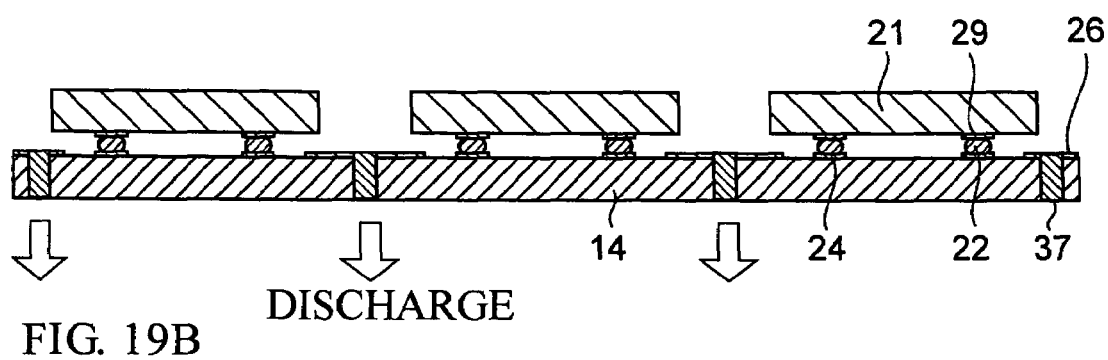
Figure 19B:
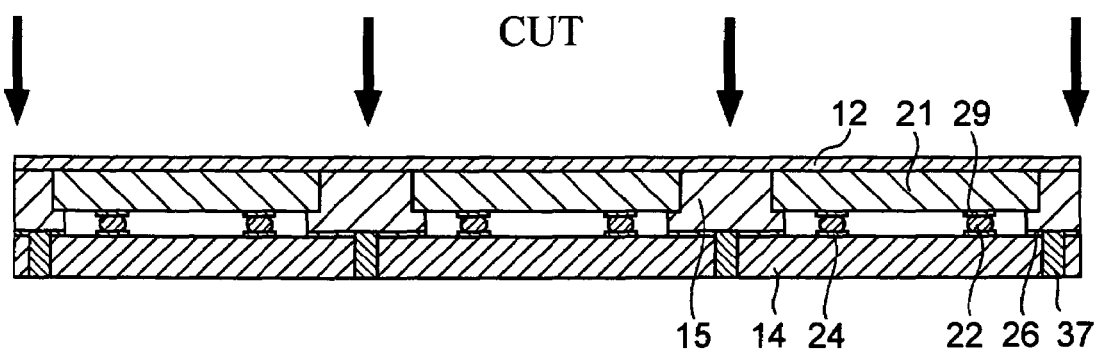
Figure 19C:
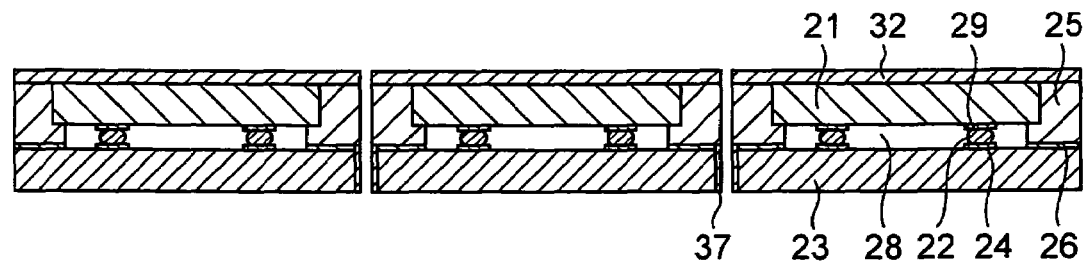

FIG. 19A through FIG. 19C illustrate a fabrication method of an electronic device in accordance with a seventh exemplary embodiment. Referring to FIG. 19A, there are provided through-bores 37 between the device chips 21 adjacently arranged in the substrate 14. There are provided one or more through-bores 37 between the device chips 21 adjacently arranged. At the time of applying heat and pressure on the solder sheet 10 and the metal layer 12 over the device chips 21, excessive gas is emitted through the through-bores 37 to the outside. Referring to FIG. 19B, dicing is effected to cut the metal layer 12, the solder 15, and the substrate through the through-bores 37. Referring to FIG. 19C, the electronic device employed in the seventh exemplary embodiment is completed.

In the fabrication method of the electronic device employed in the first exemplary embodiment, the solder 15 is not brought into contact with the substrate 14 by the gas, between the adjacent device chips. In accordance with the seventh exemplary embodiment, the through-bores 37 emit the excessive gas, as shown in FIG. 19A. This makes it possible to suppress the problem that the solder 15 is not in contact with the substrate 14 between the adjacent device chips 21. In accordance with the seventh exemplary embodiment, if the electronic device having an external size of 1.4 mm×1.0 mm is fabricated, it has been found that the yield could be improved by a large amount. When the electronic devices employed in the second through sixth exemplary embodiments are fabricated, the through-bores 37 may be provided in the substrate 14.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

What is claimed is:

1. A method of fabricating an electronic device comprising:

flip-chip mounting multiple device chips on a substrate; and supplying solder between adjacent device chips among the multiple device chips by supplying the solder on the multiple device chips and applying heat and pressure on the solder, after flip-chip mounting the multiple device chips on the substrate, wherein a contact angle of the adjacent device chips and the solder is greater than 90° with the solder melted.

2. The method as claimed in claim 1, wherein another contact angle of a surface of the substrate opposite to the adjacent device chips, and the solder is greater than 90° with the solder melted.

3. The method as claimed in claim 1, wherein supplying the solder between the adjacent device chips includes bring the solder into contact with a top of the substrate between the adjacent device chips and preventing the solder from entering between the adjacent device chips and the substrate.

4. The method as claimed in claim 1, wherein a gap between the adjacent device chips is wider than another gap between the adjacent device chips and the substrate.

5. The method as claimed in claim 1, wherein supplying the solder between the adjacent device chips includes bringing the solder into contact with a first metal pattern provided between the adjacent device chips in the substrate.

6. The method as claimed in claim 1, wherein supplying the solder between the adjacent device chips includes bringing the solder into contact with a second metal pattern provided in the periphery of a flip-chip mounting side of the multiple device chips.

7. The method as claimed in claim 1, wherein the pressure applied on the solder causes the solder to enter between the adjacent device chips without entering the adjacent device chips and the substrate.

8. The method as claimed in claim 1, wherein supplying the solder between the adjacent device chips includes applying the pressure on the solder by use of a solderless sheet supplied over the multiple device chips.

9. The method as claimed in claim 1, wherein dicing is effected to cut the solder and the substrate between the adjacent device chips.

10. The method as claimed in claim 1, wherein supplying the solder between the adjacent device chips includes supplying a solder sheet over the multiple device chips and applying the heat and the pressure on the solder sheet.

11. The method as claimed in claim 1, wherein supplying the solder between the adjacent device chips includes:

applying the heat on the substrate;

supplying the solder on a top of the multiple device chips; and applying the pressure on the solder.

12. The method as claimed in claim 1, wherein supplying the solder between the adjacent device chips includes emitting gas from a through-bore provided in the substrate.

* * * * *